United States Patent
Umezaki et al.

(10) Patent No.: US 6,518,599 B2
(45) Date of Patent: Feb. 11, 2003

(54) LIGHT-EMITTING DEVICE USING GROUP III NITRIDE GROUP COMPOUND SEMICONDUCTOR

(75) Inventors: Tamiyo Umezaki, Aichi (JP); Yuta Tezen, Aichi (JP); Toshio Hiramatsu, Aichi (JP); Masayoshi Koike, Aichi (JP)

(73) Assignees: Toyoda Gosei Co., Ltd., Aichi-ken (JP); Japan Science and Technology Corporation, Saitama-ken (JP)

( * ) Notice: Subject to any disclaimer, the term of this patent is extended or adjusted under 35 U.S.C. 154(b) by 0 days.

(21) Appl. No.: 09/725,495

(22) Filed: Nov. 30, 2000

(65) Prior Publication Data

US 2001/0013605 A1 Aug. 16, 2001

(30) Foreign Application Priority Data

Nov. 30, 1999 (JP) ............................. 11-339149

(51) Int. Cl.⁷ ............................................. H01L 33/00
(52) U.S. Cl. ............................ 257/94; 257/103; 372/44
(58) Field of Search ............................. 257/13, 79, 94, 257/95, 96, 97, 98, 103; 372/44, 47, 48, 49, 50

(56) References Cited

U.S. PATENT DOCUMENTS

| | | | |
|---|---|---|---|
| 5,880,485 A | * 3/1999 | Marx et al. | 257/94 |
| 5,953,581 A | 9/1999 | Yamasaki et al. | 438/22 |
| 6,015,979 A | * 1/2000 | Sugiura et al. | 257/86 |
| 6,111,277 A | * 8/2000 | Ikeda | 257/99 |
| 6,121,121 A | 9/2000 | Koide | |
| 6,225,650 B1 | * 5/2001 | Tadatomo et al. | 257/190 |
| 6,316,785 B1 | * 11/2001 | Nunoue et al. | 257/14 |

* cited by examiner

Primary Examiner—Sara Crane
(74) Attorney, Agent, or Firm—Pillsbury Winthrop LLP (57) ABSTRACT

A light emitting device using a group III nitride group compound semiconductor is disclosed. The device includes a substrate, a group III nitride group compound semiconductor layer, and a rectangular parallelepiped stack Rd which is formed by etching multiple group III nitride group compound semiconductor layers laminated on the group III nitride group compound semiconductor layer. The group III nitride group compound semiconductor layer comprises regions, which have many defects and less defects, respectively, and are formed in a striped pattern. Each of the boundaries between the regions with less defects and more defects or a plane which includes a longitudinal edge of the buffer layer is vertical to the substrate and parallel to a longitudinal plane of the rectangular parallelepiped stack Rd. The boundaries and two stack facets Mrr of the rectangular parallelepiped stack Rd are parallel to each other.

49 Claims, 6 Drawing Sheets

LIGHT-EMITTING DEVICE USING GROUP III NITRIDE GROUP COMPOUND SEMICONDUCTOR

CROSS REFERENCE TO RELATED APPLICATIONS

This application relates to and claims priority under 35 U.S.C. § 119 on Japanese Patent Application No. 11/339149, filed Nov. 30, 1999.

FIELD OF THE INVENTION

The present invention relates to a light emitting device using a group III nitride group compound semiconductor. In particular, the present invention relates to a light emitting device using a group III nitride group compound semiconductor in which a stack is formed on an upper surface of a group III nitride group compound semiconductor layer by epitaxial lateral overgrowth (ELO). The group III nitride group compound semiconductor layer comprises regions with many defects and regions with less defects. A group III nitride compound semiconductor can be made of binary compounds such as AlN, GaN or InN, ternary compounds such as $Al_xGa_{1-x}N$, $Al_xIn_{1-x}N$ or $Ga_xIn_{1-x}N$ where (0<x<1), or quaternary compounds $Al_xGa_yIn_{1-x-y}N$ where (0<x<1, 0<y<1, 0<x+y<1), that is, those are represented by a general formula $Al_xGa_yIn_{1-x-y}N$ where $(0 \leq x \leq 1, 0 \leq y \leq 1, 0 \leq x+y \leq 1)$. In accordance with present invention, a group III nitride group compound semiconductor includes a group III nitride group compound semiconductor which is doped with impurities to have p-type or n-type conductivity.

BACKGROUND OF THE INVENTION

A group III nitride group compound semiconductor is a direct-transition-type semiconductor having a wide emission spectrum range from ultraviolet to red, and is applied to light-emitting devices such as light-emitting diodes (LEDs) and laser diodes. The group III nitride group compound semiconductor is, in general, formed on a sapphire substrate. A laser diode, in general, comprises a guide layer and a cladding layer, which are formed on an n-type and a p-type semiconductor side of an active layer, respectively, sandwiching the same. The cladding layer is formed to have a large band gap and is generally made of $Al_xGa_{1-x}N$ where (0<x<1) including aluminum (Al), such that electrons and holes injected from negative and positive electrodes generate electron-hole pairs in the active layer. The guide layer has a little wider band gap than the active layer. The guide layer is made of, for example, gallium nitride (GaN) such that laser lights can be confined in the active layer by difference of refractive indices. The active layer preferably has a multiple quantum well (MQW) structure.

Figure 6:
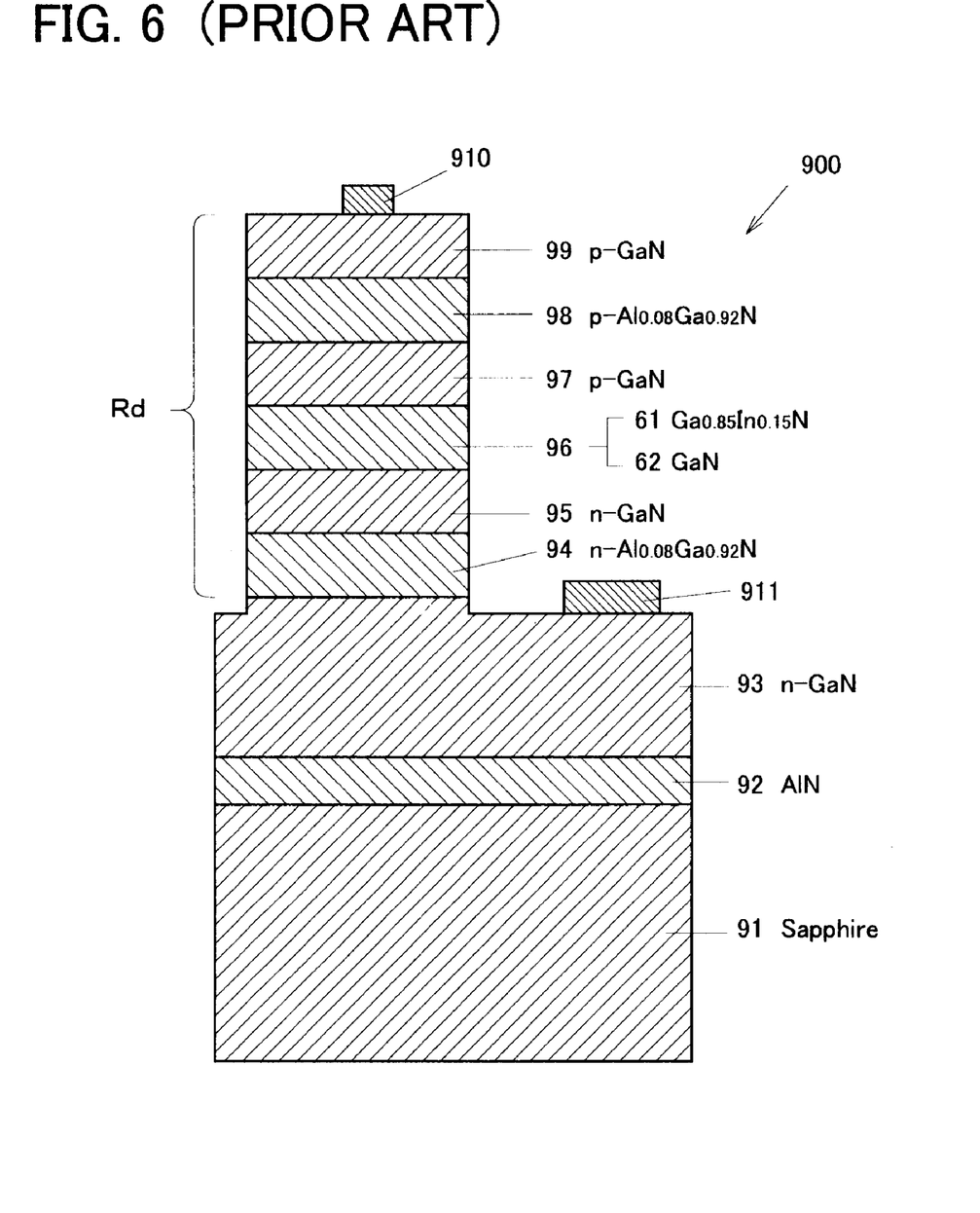
FIG. 6 is a sectional view showing the stack structure of a conventional laser diode 900.

FIG. 6 illustrates the structure of a laser diode 900 having a conventional group III nitride group compound semiconductor light-emitting device. The laser diode 900 comprises a saphire substrate 91, and an AlN buffer layer 92 formed thereon.

On the buffer layer 92, four layers are formed successively: an n-layer 93 made of silicon (Si) doped GaN; an n-cladding layer 94 made of silicon (Si) doped $Al_{0.08}Ga_{0.92}N$; an n-guide layer 95 made of silicon (Si) doped GaN; and an active layer 96 having a multiple quantum well (MQW) structure in which a barrier layer made of GaN and a well layer made of $Ga_{0.85}In_{0.15}N$ are laminated together. On the active layer 96, a p-guide layer 97 made of magnesium (Mg) doped GaN, a p-cladding layer 98 made of magnesium (Mg) doped $Al_{0.08}Ga_{0.92}N$, and a p-contact layer 99 made of magnesium (Mg) doped GaN are formed. An electrode 910 is formed on the p-contact layer 99 and another electrode 911 is formed on a portion of the n-layer 93.

Figure 7:
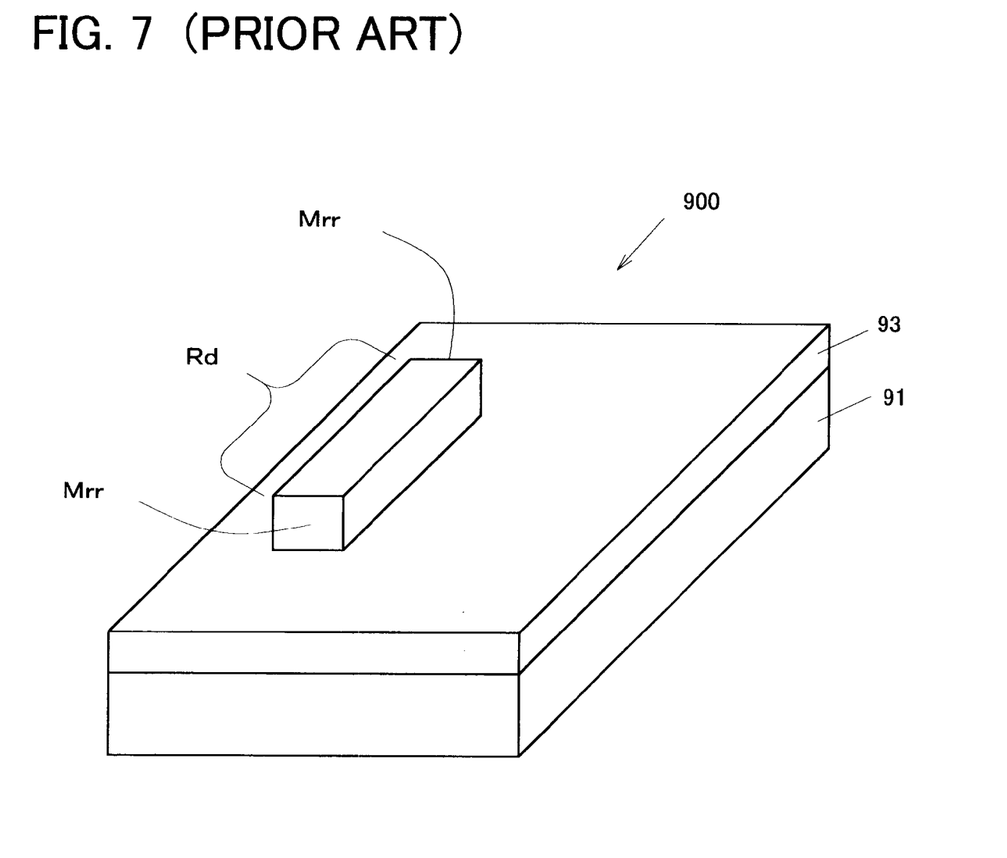
FIG. 7 is a view showing a structure of the conventional laser diode 900 of FIG. 6.

FIG. 7 is a schematic view of the laser diode 900. Rd represents a stack and Mrr represents a stack facet. Generally the stacks are formed by etching. The stack facets of several adjacent stacks form a cavity.

Figure 8:
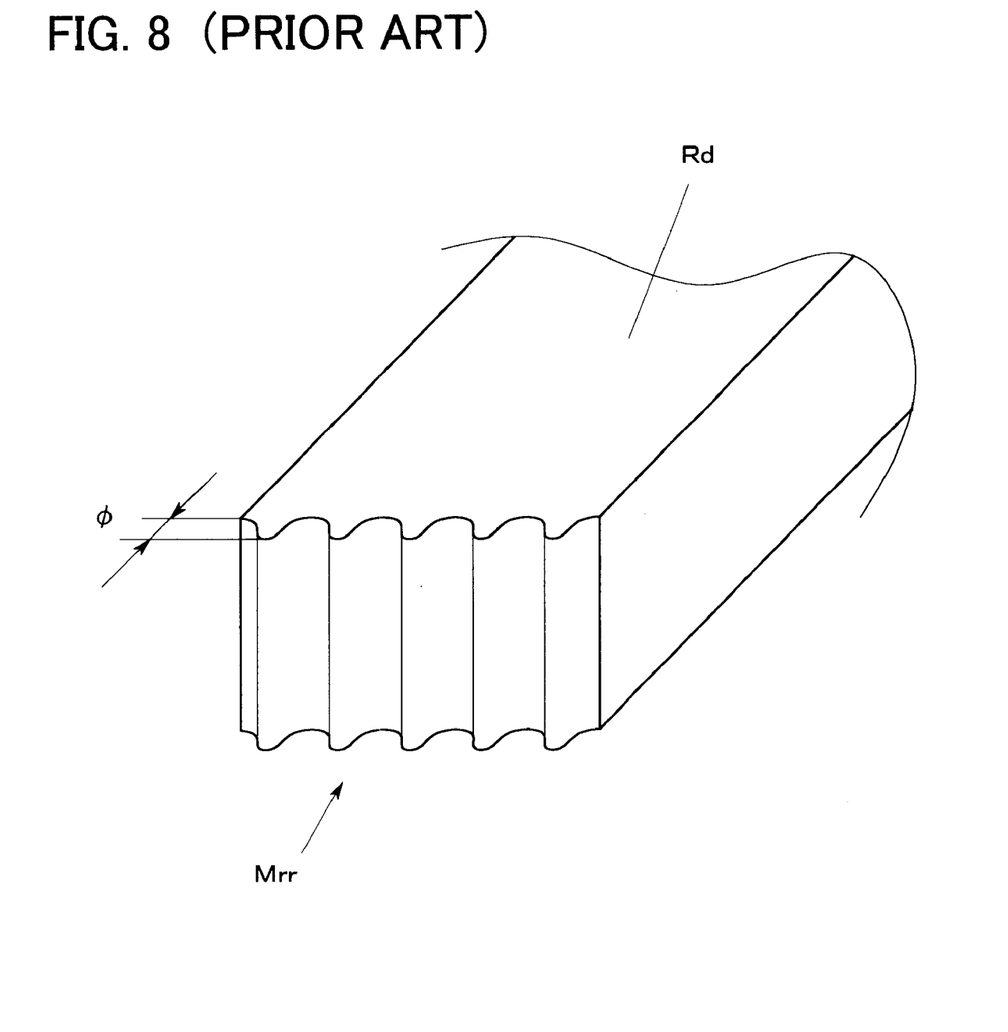
FIG. 8 is a view showing the ruggedness of a stack facet Mrr of a stack Rd in the conventional laser diode 900.

In the above-described conventional technique, however, when a layer of a group III nitride group compound semiconductor is formed on a sapphire substrate, dislocations are generated in the semiconductor layer due to a misfit between lattice constants of sapphire and the group III nitride compound semiconductor, which results in degraded device characteristics. In particular, the dislocations due to the misfit are feedthrough dislocations which penetrate the semiconductor layer in a longitudinal direction (a direction vertical to the surface of the substrate), resulting in propagation of about $10^9$ cm$^{-2}$ of dislocation in the group III nitride group compound semiconductor. The dislocations are then propagated to the uppermost layer of the group III nitride group compound semiconductor layers each having different composition. When stack facets Mrr in FIG. 7 are formed by etching, ruggedness shown by $\phi$ in FIG. 8 is generated on the stack facets Mrr due to feedthrough dislocations. The ruggedness $\phi$ is about 20 nm in depth and formed in cylindrical pattern. Accordingly, the stack facets of the conventional laser diode 900 are remarkably far from ideal stack facets, which have a specular surface having no ruggedness. As a result, the oscillation efficiency of laser reflection becomes remarkably worse.

OBJECT OF THE INVENTION

It is an object of the present invention to provide a light emitting device that overcomes the above-identified deficiencies.

It is another object of the present invention to provide a light emitting device using a group III nitride group compound semiconductor which comprises stack or resonator facets having less ruggedness.

It is another object of the present invention to provide a light emitting device having a group III nitride group compound semiconductor layer having a plurality of distinct regions having many defects and a plurality of distinct regions having less defects.

It is another object of the present invention to provide a light emitting device having a group III nitride group compound semiconductor layer having a plurality of distinct regions having many defects and a plurality of distinct regions having less defects, wherein the stack facets of a stack are arranged in an area having less defects.

It is another object of the present invention to provide a light emitting device using a group III nitride group compound semiconductor that efficiently suppreses feedthrough dislocations that are transmitted to the substrate in vertical direction.

These and other objects of the present invention will apparent in view of the description of the present invention and claims set forth below.

SUMMARY OF THE INVENTION

The present invention is directed to a light emitting device using a group III nitride group compound semiconductor comprising a group III nitride group compound semiconductor and a stack which is formed on the upper surface of a group III nitride group compound semiconductor layer comprising regions with many defects or less defects. The stack is formed so as to traverse the regions of the group III nitride group compound semiconductor layer with many defects and less defects and a stack facet is formed on the region of the group III nitride group compound semiconductor layer with less defects. The stack is formed by employing a process, e.g., cleaving or etching the laminated group III nitride group compound semiconductor layer.

In accordance with the present invention, the light emitting device may include a plurality of stacks which form cavities. The stacks may be formed by etching. It is contemplated that the light emitting device may be a laser diode or a light emitting diode.

In accordance with the present invention, the regions of the group III nitride group compound semiconductor layer with many defects and those regions with less defects are formed in a striped pattern at least near the stack facets. Here a striped pattern does not necessarily represents a rectangular with a short edge and a long edge. It is adequate if each boundaries between the regions of the group III nitride group compound semiconductor with many defects and less defects, which are placed near the stack facets, is a straight line and almost parallel to each other. Boundaries may not be necessarily observed by an apparatus but may be recognizable in a manufacturing process as a divided line that divides the regions with many defects and less defects.

In accordance with the present invention, the stack facets may be parallel to the boundaries between the regions of the group III nitride group compound semiconductor with many defects and less defects, which are placed near the stack facets. Boundaries are used to distinguish the group III nitride group compound semiconductor layer. For example, when the group III nitride group compound semiconductor are formed on the substrate, the boundaries are vertical to the surface of the substrate. Boundaries may not be necessarily observed by an apparatus but may be recognizable in a manufacturing process in order that regions with many defects and less defects exist divided by the boundaries. And a boundary surface may not necessarily correspond to a growing facet when the group III nitride group compound semiconductor layer grows by epitaxial growth.

In accordance with the present invention, each boundary between the regions of the group III nitride group compound semiconductor with many defects and less defects, which are placed near the stack facets, is a {11–20} surface of the group III nitride group compound semiconductor. Boundaries are used to divide the region of the group III nitride group compound semiconductor layer. For example, when the group III nitride group compound semiconductor are formed on the substrate, the boundaries are vertical to the surface of the substrate. Boundaries may not be necessarily observed by an apparatus but may be recognizable in a manufacturing process so that regions with many defects and less defects can be proved to exist divided by the boundaries.

In accordance with the present invention, at least a bottom layer which exists in the regions of the group III nitride group compound semiconductor with less defects is formed by epitaxial lateral overgrowth (ELO). Epitaxial lateral overgrowth (ELO) represents, for example, an epitaxial growth in a direction parallel to the surface of the substrate when the group III nitride group compound semiconductor is formed on the substrate. The group III nitride group compound semiconductor may also grow longitudinal direction (a normal direction of the surface of the substrate) epitaxially accompanying with ELO.

In accordance with another aspect of the present invention, at least a bottom layer which exists in the regions of the group III nitride group compound semiconductor with less defects is a group III nitride group compound semiconductor layer whose growing facet by epitaxial lateral overgrowth (ELO) is a {11–20} surface, or a group III nitride group compound semiconductor layer which is formed on the group III nitride group compound semiconductor layer grown by epitaxial lateral overgrowth (ELO) with a growing facet of {11–20} surface. The group III nitride group compound semiconductor layer comprising regions with many defects or less defects is grown by epitaxial lateral overgrowth (ELO) as a growing facet of {11–20}. This does not necessarily exclude the possibility that the group III nitride group compound semiconductor layer grows epitaxially in longitudinal direction while it grows epitaxially in lateral direction. The group III nitride group compound semiconductor layer may be grown epitaxially not only in lateral direction but also in longitudinal direction. Also, the second group III nitride group compound semiconductor layer is formed on the first group III nitride group compound semiconductor layer which is grown by epitaxial lateral overgrowth (ELO). This does not necessarily exclude the possibility that a first group III nitride group compound semiconductor layer grows epitaxially in longitudinal direction while it grows epitaxially in lateral direction. The first group III nitride group compound semiconductor layer may be grown epitaxially not only in lateral direction but also in longitudinal direction. Compositions of the second group III nitride group compound semiconductor layer which is formed on the first group III nitride group compound semiconductor layer and the first group III nitride group compound semiconductor layer, respectively, can be same or different. Also, impurities doped into the first and the second group III nitride group compound semiconductors, respectively, and their doping amount can be same or different. Further, an arbitrary number of group III nitride group compound semiconductor layer can be laminated on the first group III nitride group compound semiconductor layer which is grown by epitaxial lateral overgrowth (ELO).

A light emitting device using a group III nitride group compound semiconductor comprises a stack. The stack is formed so as to traverse regions of a group III nitride group compound semiconductor layer with many defects or less defects and a stack facet is formed on the region of the group III nitride group compound semiconductor layer with less defects. As a result, only by forming the regions with less defects extremely small, ruggedness of the stack facet formed in the laser diode using group III nitride group compound semiconductor can be suppressed. The ruggedness is suppressed remarkably when the stack, especially the stack facet, is formed by etching. The group III nitride group compound semiconductor layer comprises regions with many defects or less defects formed in a striped pattern at least near the stack facets. The size of the region formed in a striped pattern is sufficient if the stack facets can be formed thereon. By forming the stack facets to be parallel to boundaries between the regions of the group III nitride group compound semiconductor layer with many defects and less defects, which are placed near the stack facets, the region with less defects can be formed smaller. When each boundaries between the regions of the group III nitride group compound semiconductor layer with many defects and less defects, which are placed near the stack facets, is a {11–20} surface of the group III nitride group compound semiconductor layer, etching process can be carried out easier by adjusting the stack facets to be the {11–20} surface, resulting in suppressing the ruggedness on the surface of the group III nitride group compound semiconductor layer.

The group III nitride group compound semiconductor layer comprising regions with many defects and less defects can be easily formed by epitaxial lateral overgrowth (ELO). Especially the growing facet of the group III nitride group compound semiconductor layer by ELO is adjusted to be the {11–20} surface of the group III nitride group compound semiconductor layer. In this case the growing facet of the group III nitride group compound semiconductor layer growing epitaxially in lateral direction becomes vertical to the substrate. As a result, feedthrough dislocations that are transmitted to the substrate in vertical direction can be suppressed efficiently.

BRIEF DESCRIPTION OF THE DRAWINGS

The present invention will be described in conjunction with the following drawings in which like reference numerals designate like elements and wherein.

DETAILED DESCRIPTION OF THE PREFERRED EMBODIMENTS

Figure 1:
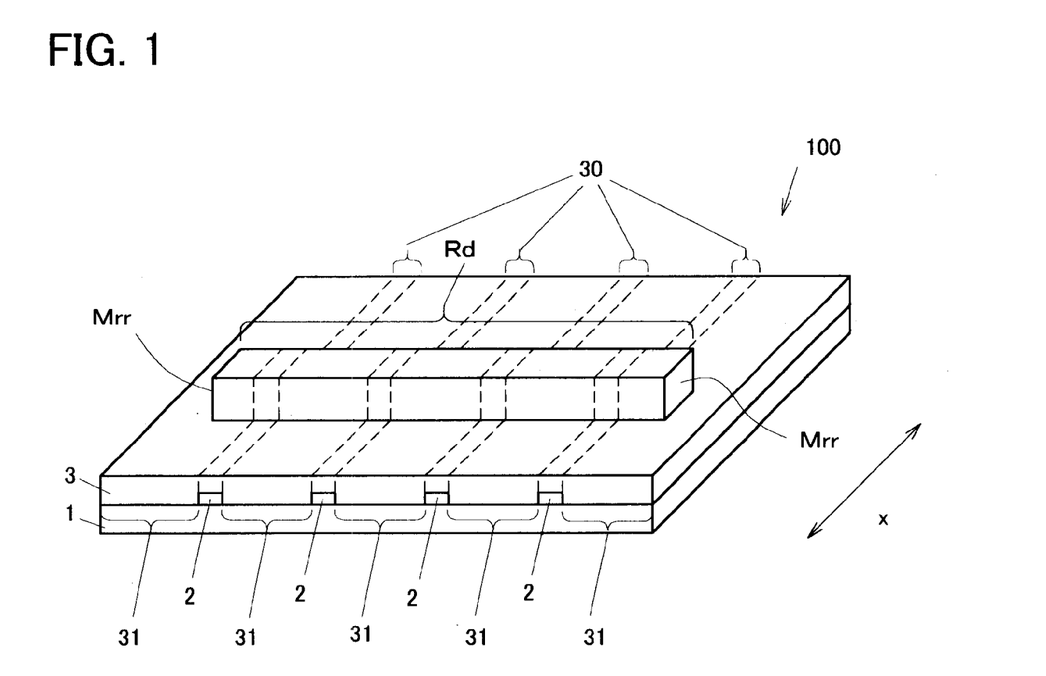
FIG. 1 is a view showing a structure of a light emitting device in accordance with the present invention.

FIG. 1 illustrates a structure of a light emitting device 100 in accordance with the present invention. In accordance with the present invention, it is contemplated that the light emitting device 100 may be either a laser diode or a light emitting diode. The light emitting device 100 has a substrate 1 on which a group III nitride group compound semiconductor layer 3 is formed. Multiple group III nitride group compound semiconductor layers are formed on the group III nitride group compound semiconductor layer 3. The layers are then etched and a rectangular parallelepiped stack or stack (referred to as stack hereinafter) Rd is obtained. The group III nitride group compound semiconductor layer 3 has regions 30 with many defects and regions 31 with less defects. The number of defects in the regions 31 is significantly less than the number of defects in the regions 30. The regions 30 and 31 are preferably formed in a striped pattern, as shown in FIGS. 1 and 3–5. As shown in FIG. 1, buffer layers 2 are formed as a bottom layer for the regions 30 with many defects. The regions 30 are formed on the buffer layer 2. The regions 31 are formed directly on the substrate 1. The boundaries between the regions 30 and 31 of the group III nitride group compound semiconductor layer 3 generally form a plane that includes a longitudinal edge of the buffer layer 2 and is vertical to the substrate, is parallel to a longitudinal plane of the rectangular parallelepiped stack Rd, and each boundaries and two stack facets Mrr of the rectangular parallelepiped stack Rd are parallel to each other. The two stack facets Mrr of the rectangular parallelepiped stack Rd are formed shifted from the center of the region 31 with less defects, or the center of each boundaries between the regions 30 and 31 with many defects and less defects. By such construction, the stack facet can be formed in the region with less defects. In FIG. 1, the two stack facets Mrr of the stack Rd are formed on the regions with less defects which is formed in a striped pattern. The light emitting device 100 can be formed as follows.

The light emitting device 100 is formed by applying group III nitride group compound semiconductor layers alternately on the substrate 1. The substrate 1 can be made of sapphire, silicon (Si), silicon carbide (SiC), spinel ($MgAl_2O_4$), ZnO, MgO, other inorganic crystal substrate, gallium nitride (GaN) and other group III nitride group compound semiconductor having suitable properties to function as a substrate.

The group III nitride group compound semiconductor layer 3 is preferably formed through the use of a metal organic vapor phase deposition (MOCVD or MOVPE). The present invention, however, is not limited to these manufacturing processes; rather, other processes are contemplated including but not limited to molecular beam epitaxy (MBE) and Halide vapor phase epitaxy (Halide VPE).

For example, to grow the group III nitride group compound semiconductor layer having excellent crystallinity, a buffer layer is preferably formed on the substrate for compensating for the lattice mismatch between the substrate and the group III nitride group compound semiconductor layer. Even when the substrate is made of other materials, a buffer layer is preferably formed on the substrate when the group III nitride group compound semiconductor layer is formed on the substrate. The buffer layer may be made of a group III nitride group compound semiconductor satisfying the formula $Al_xGa_yIn_{1-x-y}N$ where ($0 \leq x \leq 1$, $0 \leq y \leq 1$, $0 \leq x+y \leq 1$), which is formed at a low temperature. Preferably, the buffer layer is made of $Al_xGa_{1-x}N$ where ($0 \leq x \leq 1$). The buffer layer may include a single layer structure or a multiple layer structure which comprises layers each having different compositions.

The buffer layer or the upper group III nitride group compound semiconductor layer can be also made of a group III nitride group compound in which a part of the group III element is changed to boron (B) or thallium (Tl), and a part of the nitrogen (N) is changed to phosphorus (P), arsenic (As), antimony (Sb), bismuth (Bi), and so on. When the group III nitride group compound semiconductor functions as a light-emitting device, a binary or a ternary group III nitride group compound semiconductor may be preferably employed.

When the group III nitride group compound semiconductor layer has n-type conductivity, group IV and group VI elements such as, for example, Si, Ge, Se, Te, and C may be doped into as n-type impurities. When the group III nitride group compound semiconductor layer has p-type conductivity, group II and group IV elements such as Zn, Mg, Be, Ca, Sr, and Ba can be doped as p-type impurities.

A group III nitride group compound semiconductor layer comprising distinct regions with many defects or less defects is preferably formed using epitaxial lateral overgrowth (ELO). The facet which is growing at the top by epitaxial lateral overgrowth (ELO) is preferably vertical to the surface of the substrate. Alternatively, the growing facet can be a facet plane which is oblique to the surface of the substrate. The regions with less defects can exist only near a stack facet. Alternatively, the regions with less defects can exist in a scattered manner in the whole region where a stack is formed. For example, the distinct regions with many defects and less defects can be formed alternately in a striped pattern and the stack can be formed so as to traverse the regions with many defects and less defects perpendicularly to the striped regions, as shown in FIG. 1. The striped regions with less defects may or may not exist in part except for near the stack facets under the stack.

The boundaries of the regions with many defects and less defects are preferably parallel to the stack facets. More preferably, the growing facet of the group III nitride group compound semiconductor layer is parallel to the stack facets. Further preferably, the growing facet and each boundaries between the regions with many defects and less defects are {11–20} ('a'-surface) surfaces of the group III nitride group compound semiconductor.

In the epitaxial lateral overgrowth (ELO) process, a method of forming a mask on the upper surface of the substrate or the group III nitride group compound semiconductor layer formed on the substrate, a method of etching the group III nitride group compound semiconductor layer, or a combination of these methods can be employed. Etching can be carried out until the substrate is exposed, or etching can be carried out until a desired depth which is possible for ELO in relation to the width. When a mask is formed on the upper surface of the group III nitride group compound semiconductor layer, the mask may be formed on the upper surface of the buffer layer formed on the substrate. In the process of etching the group III nitride group compound semiconductor layer, the buffer layer on the substrate may be etched.

When the crystal axis direction of the group III nitride group compound semiconductor layer on the substrate is determined, it is useful to form a mask or to carry out etching in a striped pattern so that the striped regions become vertical to a surface 'a' or 'm' of the group III nitride group compound semiconductor layer. The present invention, however, is not limited to a striped a pattern. Alternatively, the mask can be formed into an arbitrary shape such as an island pattern or a grid pattern. The growing facet of the group III nitride group compound semiconductor layer grows by epitaxial lateral overgrowth (ELO) is vertical to the surface of the substrate. Alternatively, the growing facet can be a plane which is oblique to the surface of the substrate. In order that the growing facet become the surface 'a' of the group III nitride group compound semiconductor layer, a longitudinal plane of the group III nitride group compound semiconductor layer formed in a striped pattern is vertical to the surface 'm' of the group III nitride group compound semiconductor layer. For example, when the surface orientation of the substrate is adjusted to a surface 'a' or 'c' of a sapphire, a surface 'm' of the sapphire corresponds to a surface 'a' of the group III nitride group compound semiconductor layer laminated thereon. Accordingly when a mask is formed or etching is carried out, it is convenient to use this orientation dislocation.

To form a mask, oxides and nitrides such as silicon oxide ($SiO_2$), silicon nitride ($Si_3N_4$), titanium oxide ($TiO_x$), and zirconium oxide ($ZrO_x$), multiple layers of these compounds, and metals whose fusing point is more than 1200° C., e.g., tungsten (W), can be used. The mask should endure at a growth temperature of the group III nitride group compound which is in a range of 600° C. to 1000° C. Also, the mask should be made of materials on which the group III nitride group compound semiconductor never grows or has difficulty growing. The mask may be formed by evaporating, sputtering, a vapor phase epitaxy such as CVD. Other methods may be used to form the mask.

A light emitting stack may be formed easily by cleavage and etching. Reactive ion beam etching (RIBE) may be preferably used in etching process. The present invention, however, is not limited to this etching process; rather, it is contemplated that an arbitrary etching method or other suitable etching technique may be employed.

An emission layer formed in the light emitting device preferably has a multiple quantum well (MQW) structure. Alternatively, the emission layer may have a single quantum well (SQW) structure. Further alternatively, the emission layer can have a homojunction structure, a heterojunction structure, or a double heterojunction structure. These structures can be formed through formation of, for example, a pin junction or a p-n junction.

The invention will be more fully understood by reference to the following embodiment, but not limited thereto.

Figure 2:
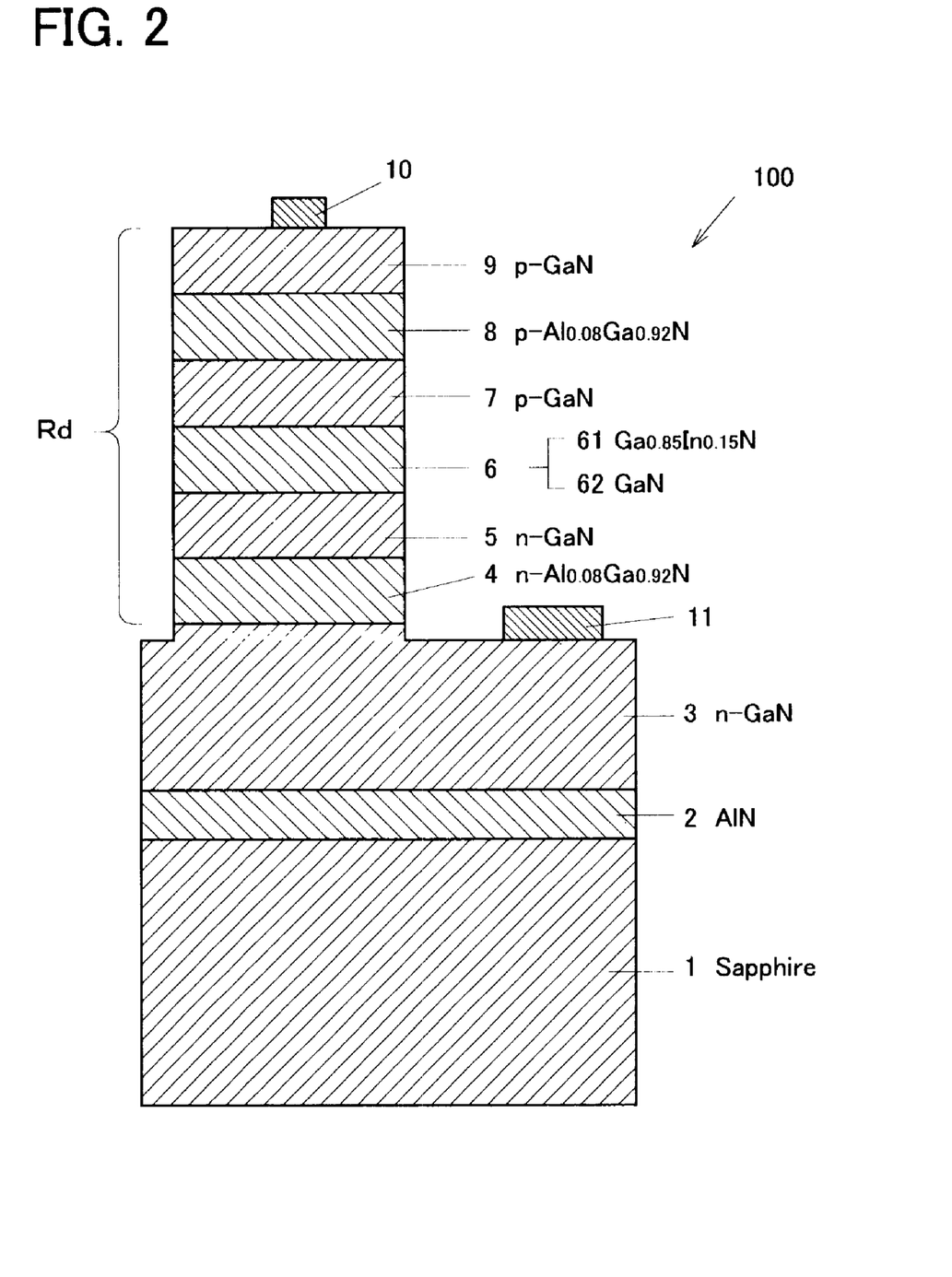
FIG. 2 is a sectional view of the stack structure of the light emitting device of FIG. 1 according to the present invention.

FIG. 2 is a sectional view illustrating a structure of a light emitting device 100 in accordance with the present invention. For the sake of convenience, this is a sectional view of a part of the light emitting device 100 having a buffer layer. The light emitting device 100 comprises a sapphire substrate 1, and an AlN buffer layer 2 is formed thereon. The AlN buffer layer 2 may have a thickness of 50 nm. The buffer layer 2 formed on the sapphire substrate 1 is, as described below, etched in a striped pattern.

On the buffer layer 2 and the exposed portions of the substrate 1, about 5 $\mu$m in thickness of silicon (Si) doped GaN, having an electron concentration of $2 \times 10^{18}/cm^3$, is formed as an n-layer 3. About 1 $\mu$m in thickness of silicon (Si) doped $Al_{0.08}Ga_{0.92}N$, having an electron concentration of $2 \times 10^{18}/cm^3$, is formed on the n-layer 3 as an n-cladding layer 4. About 100 nm in thickness of silicon (Si) doped GaN, having an electron concentration of $2 \times 10^{18}/cm^3$, is formed on the n-cladding layer 4 as an n-guide layer 5.

An active layer 6 having a multiple quantum well (MQW) structure is formed on the n-guide layer 5. In the active layer 6, at least four well layers made of $Ga_{0.85}In_{0.15}N$, each having a thickness of about 3 nm, and at least three barrier layers made of GaN, each having a thickness of about 5 nm, are alternately formed. About 100 nm in thickness of magnesium (Mg) doped GaN, having a hole concentration of $5 \times 10^{17}/cm^3$, is formed on the active layer 6 as a p-guide layer 7.

In accordance with the present invention described herein, it is contemplated that there may be variations in thicknesses described herein. Variations in thicknesses are considered to be well within the scope of the present invention.

About 1 $\mu$m in thickness of magnesium (Mg) doped $Al_{0.08}Ga_{0.92}N$ p-cladding layer 8, having a hole concentration of $5 \times 10^{17}/cm^3$, is formed on the p-guide layer 7. About 300 nm in thickness of magnesium (Mg) doped GaN p-contact layer 9, having a hole concentration of $5 \times 10^{17}/cm^3$, is formed on the p-cladding layer 8. An electrode layer 10 made of nickel (Ni) is formed on a portion of the p-contact layer 9. Another electrode 11 made of aluminum (Al) is formed on a portion of the n-layer 3. It is contemplated that other materials may be used to form the electrodes 10 and 11.

The n-cladding layer 4, the n-guide layer 5, the active layer 6, the p-guide layer 7, the p-cladding layer 8, and the p-contact layer 9 are formed as a stack by etching. The longitudinal direction of these layers, i.e., the stack, is vertical to a longitudinal direction of the buffer layer 2 which is etched in a striped pattern. Stack facets Mrr of the stack are parallel to the longitudinal direction of the buffer layer 2, as shown in FIG. 1. FIG. 1 is a view to explain the main point of this invention. Actually 40 to 50 pairs of regions 30 and 31 with many defects and less defects are formed and the stack Rd is formed to traverse those 80 to 100 regions.

A method for manufacturing this light-emitting device (e.g., semiconductor laser) is explained hereinafter. Each of the semiconductor layers of the light-emitting device 100 was formed by gaseous phase epitaxial growth, called metal organic vapor phase deposition (hereinafter MOVPE). The gases employed in this process were ammonia ($NH_3$), a carrier gas ($H_2$ or $N_2$), trimethyl gallium ($Ga(CH_3)_3$, hereinafter TMG), trimethyl alminum ($Al(CH_3)_3$, hereinafter TMA), trimethyl indium ($In(CH_3)_3$, hereinafter TMI), silane ($SiH_4$), and biscyclopentadienyl magnesium ($Mg(C_5H_5)_2$, hereinafter $CP_2Mg$).

A single crystalline sapphire substrate 1 is formed to have a main surface 'a' which is cleaned by an organic washing solvent and heat treatment. An AlN buffer layer 2, having a thickness of about 50 nm, is then formed on the surface 'a' of the sapphire substrate under conditions controlled by lowering the temperature to 400° C. and concurrently supplying $H_2$, $NH_3$ and TMA at a flow rate of 10 L/min, 10 L/min, 20 μmol/min, respectively. The buffer layer 2 is then dry-etched in a striped pattern by selective dry-etching including reactive ion etching (RIE) using a hard baked resist mask. Accordingly, the AlN buffer layer 2 is formed in a striped pattern such that each region defined above the buffer layer 2, having a width of 5 μm, and each region where the sapphire substrate 1 was exposed, having a width of 5 μm, are formed alternatively. A longitudinal direction of the buffer layer 2 in a striped pattern is parallel to <0001> orientation of the substrate. The present invention, however, is not limited to a striped pattern; rather, other arrangements are contemplated provided the stack facet is located in a region with less defects or on a boundary of a region with less defects.

Figure 3:
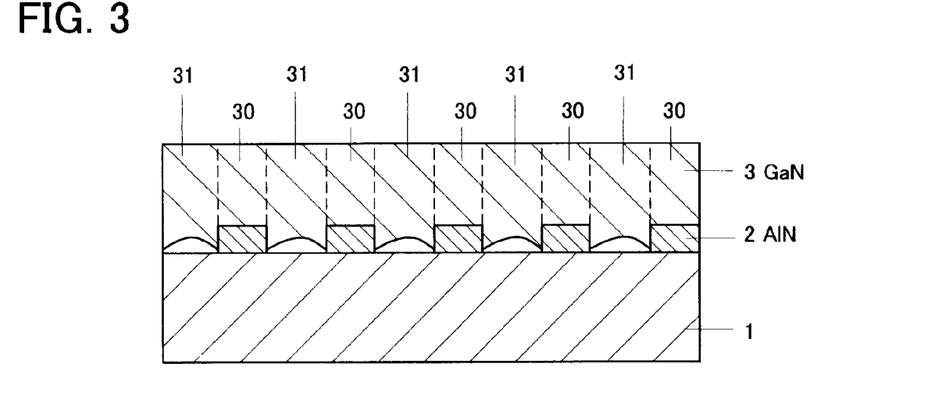
FIG. 3 is a sectional view of a GaN layer 3 comprising regions 30 with many defects and regions 31 with less defects according to an embodiment of the light emitting device of the present invention.

A GaN layer 3 having thickness of several thousand Å was grown to cover the entire surface of the substrate and the AlN buffer layer, while maintaining the substrate 1 at a temperature of 1150° C., and feeding $H_2$, $NH_3$ and TMG at 20 L/min, 10 L/min and 5 μmol/min, respectively. TMG is then fed at 300 μmol/min and silane ($SiH_4$) diluted to 0.86 ppm by $H_2$ at 100 mol/min, thereby obtaining about 5 μm in thickness of GaN layer 3 at a growth temperature of 1000° C. In this embodiment, the GaN layer 3 was formed by growing GaN regions 31 epitaxially above the sapphire substrate 1 in a lateral direction, from the GaN regions 30 which grows epitaxially on the upper surface of the AlN buffer layer 2 in a longitudinal direction and serves as a nucleus. Accordingly, GaN regions 31 having excellent crystallinity can be obtained above the regions where the AlN buffer layer 2 is not formed and the sapphire substrate 1 is exposed. The GaN regions 31 are shown in FIG. 3. FIG. 3 is a sectional view of the buffer layer 2 vertical to a longitudinal direction of its striped pattern. Each boundaries (represented by a dotted line in FIG. 3) between the GaN regions 31 having excellent crystallinity (with less defect) and the GaN regions 30 which were grown epitaxially in longitudinal direction on the upper surface of the buffer layer 2 is a {11–20} surface of the GaN layer 3.

After forming the GaN layer 3, about 1 μm in thickness of $Al_{0.08}Ga_{0.92}N$ n-cladding layer 4 is formed thereon under conditions concurrently supplying $H_2$ or $N_2$, $NH_3$, TMA, TMG, and silane ($SiH_4$). About 100 nm in thickness of GaN n-guide layer 5 is formed on the n-cladding layer 4 under conditions concurrently supplying $H_2$ or $N_2$, $NH_3$, TMG, and silane ($SiH_4$).

About 3 nm in thickness of $Ga_{0.85}In_{0.15}N$ was formed on the n-guide layer 5, as a well layer, concurrently supplying $N_2$ or $H_2$, $NH_3$, TMG, and TMI. About 5 nm in thickness of GaN was formed on the well layer, as a barrier layer, under conditions concurrently supplying $N_2$ or $H_2$, $NH_3$, and TMG. At least two pairs of a well layer and a barrier layer were formed under the same condition described above, and then about 3 nm in thickness of $Ga_{0.85}In_{0.15}N$ well layer was formed thereon. Accordingly, an active layer 6 with a multiple quantum well (MQW) structure, having four periods of well layers, was obtained.

About 100 nm in thickness of GaN p-guide layer 7 was formed on the active layer 6 by concurrently supplying $N_2$ or $H_2$, $NH_3$, TMG, and $CP_2Mg$. About 1 μm in thickness of $Al_{0.08}Ga_{0.92}N$ p-cladding layer 8 was formed on the p-guide layer 7 by concurrently supplying $N_2$ or $H_2$, $NH_3$, TMA, TMG, and $CP_2Mg$.

About 300 nm in thickness of magnesium (Mg) doped GaN p-contact layer 9 was formed on the p-cladding layer 8, under conditions by keeping the temperature of the sapphire substrate 1 at 1100° C. and concurrently supplying $N_2$ or $H_2$, $NH_3$, TMG, and $CP_2Mg$ at a flow rate of 10 L/min, 10 L/min, 100 μmol/min, and 2 μmol/min, respectively.

Then, electron rays were uniformly irradiated into the three layers using a reflective electron beam diffraction device. By this irradiation the p-contact layer 9, the p-cladding layer 8, and the p-guide layer 7 has respective hole concentrations $5 \times 10^{17}/cm^3$, $3 \times 10^{17}/cm^3$, and $5 \times 10^{17}/cm^3$. As a result, a wafer with a multiple layer structure was obtained.

An $SiO_2$ layer was formed on the p-contact layer 9 by sputtering, and a photoresist layer was laminated on the $SiO_2$ layer and photolithography process was executed. The photoresist layer of the electrode forming part on the n-layer 3 was removed and the $SiO_2$ layer, which is not covered by the photoresist layer, was removed by using hydrofluoric acid system etching solution.

The p-contact layer 9, the p-cladding layer 8, the p-guide layer 7, the active layer 6, the n-guide layer 5, the n-cladding layer 4, and a portion of the n-layer 3, which were not covered by the photoresist layer and the $SiO_2$ layer, were dry-etched. Accordingly, an electrode region was formed on the n-layer 3 and also sides along longitudinal direction of the stack were formed. The longitudinal sides of the stack is vertical to a longitudinal direction of the buffer layer 2 which was etched in a striped pattern.

Nickel (Ni) was deposited on the p-contact layer 9, and an electrode 10 was formed thereon. Aluminum (Al) was deposited on the n-layer 3, and an electrode 11 was formed thereon.

Dry-etching is carried out to form a stack facet Mrr. The stack facet is formed to be parallel to the longitudinal direction of the buffer layer 2 that was etched in a striped pattern. A scribing groove is formed in a scribing process. Then strips were obtained by dicing in x-axis direction, which is parallel to the stack facet. The thus-obtained laser diode 100 was found to have the stack facet Mrr having ruggedness of less than 10 nm and an output power of 10 mW and an oscillation wavelength of 410 mn when driving current supplied to the device is 50 mA.

For comparison, a conventional laser diode 900 was formed as shown in FIG. 6. The laser diode 900 has the same composition ratio, materials, thickness of each layers, etching and other process as those of the light emitting device 100 except that a buffer layer 92 which is formed to cover the entire surface of a sapphire substrate 91 is not etched. Ruggedness of a stack facet Mrr in the conventional laser diode 900 is 20 nm.

Figure 4:
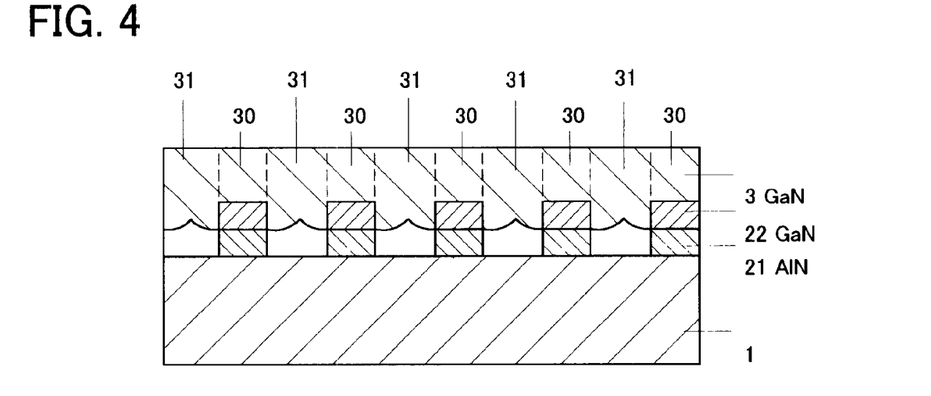
FIG. 4 is a sectional view of a GaN layer 3 comprising regions 30 with many defects and regions 31 with less defects according to another embodiment of the light emitting device of the present invention.

In the embodiment illustrated in FIG. 3, the AlN buffer layer 2 is etched. But in another embodiment, several thousand Å in thickness of single crystalline GaN layer 22 formed on an AlN buffer layer 21 is etched in a striped pattern, as shown in FIG. 4. Then a light emitting device having the same structure as that of the light emitting device 100 in the embodiment of FIG. 3 is formed. Raggedness of the stack facet Mrr is 10 nm or less.

Figure 5:
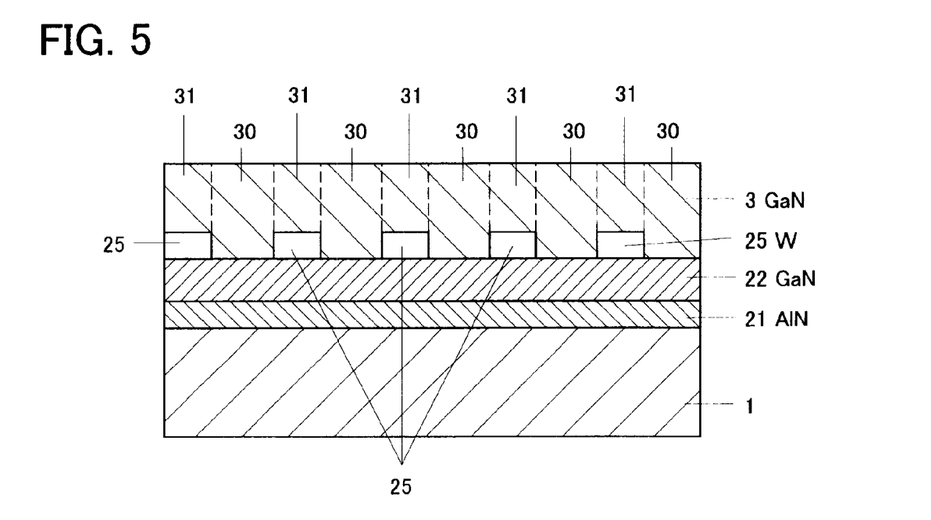
FIG. 5 is a sectional view of a GaN layer 3 comprising regions 30 with many defects and regions 31 with less defects according to yet another embodiment of the light emitting device of the present invention.

In the embodiment illustrated in FIG. 3, the AlN buffer layer 2 is etched. But in another embodiment, thousands Å in thickness of single crystalline GaN layer 22 is formed on an AlN buffer layer 2, and a mask made of tungsten (W) is formed by sputtering in a striped pattern as shown in FIG. 5. Then a light emitting device having the same structure as that of the light emitting device 100 in the embodiment of FIG. 3 is formed. Raggedness of the stack facet Mrr is 10 nm or less.

Group III nitride group compound semiconductor composition ratios of the layers in a multiple layer structure and well and barrier layers in the active layer having a multiple quantum well (MQW) structure are not limited to the above embodiments. Alternatively, a group III nitride group compound semiconductor satisfying the formula $Al_xGa_yIn_{1-x-y}N$ where ($0 \leq x \leq 1$, $0 \leq y \leq 1$, $0 \leq x+y \leq 1$) can be employed to form each sub-layer. The layers need not have identical compositions and may each have different aluminum composition x, gallium composition y, and indium composition 1-x-y.

Composition ratio of each layers, each electrodes and a mask and method of etching are not limited to the above embodiments. In the above embodiments, epitaxial lateral overgrowth is carried out by controlling a quantity of supplying ammonia (NH3) and trimethyl gallium (TMG). Alternatively, ELO can be carried out by controlling a temperature and a pressure in a reaction chamber.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A light emitting device using a group III nitride group compound semiconductor comprising:
    a substrate;
    at least one layer of a group III nitride group compound semiconductor formed on said substrate, wherein said at least one group III nitride group compound semiconductor layer includes at least one region with many defects and at least one region with less defects; and
    at least one stack of layers which is formed on said at least one group III nitride group compound semiconductor layer, wherein each of said at least one stack traverses at least a portion of said at least one region with many defects and said at least one region with less defects in a longitudinal direction, wherein each of said at least one stack of layers includes a pair of stack facets, wherein said pair of stack facets is formed in one of said at least one region having less defects and is parallel to a boundary between said at least one region of more defects and said at least one region of less defects said pair of stack facets being a laser cavity facet from which a laser light is outputted.

2. The light emitting device according to claim 1, further comprising: a buffer layer formed between said substrate and at least said regions of said at least one layer of a group III nitride group compound semiconductor having more defects.

3. The light emitting device according to claim 1, wherein said pair of stack facets is formed by etched surfaces.

4. The light emitting device according to claim 3, wherein said at least one region with many defects and said at least one region with less defects are formed in a striped pattern on said substrate at least near said stack facet.

5. The light emitting device according to claim 4, further comprising: a buffer layer formed between said substrate and at least said regions of said at least one layer of a group III nitride group compound semiconductor having more defects.

6. The light emitting device according to claim 3, wherein at least a bottom layer of said group III nitride group compound semiconductor layer in said regions having less defects is formed by epitaxial lateral overgrowth.

7. The light emitting device according to claim 3, wherein at least said bottom layer is one of a group III nitride group compound semiconductor layer whose growing facet by epitaxial lateral overgrowth is a {11–20} surface, and a group III nitride group compound semiconductor layer that is formed on said group III nitride group compound semiconductor layer formed by epitaxial lateral overgrowth, whose growing facet is a {11–20} surface.

8. The light emitting device according to claim 1, wherein said at least one region with many defects and said at least one region with less defects are formed in a striped pattern on said substrate at least near said stack facet.

9. The light emitting device according to claim 8, further comprising: a buffer layer formed between said substrate and at least said regions of said at least one layer of a group III nitride group compound semiconductor having more defects.

10. The light emitting device according to claim 8, wherein said stack facet is formed to be parallel to said boundaries between said region of more defects and said region of less defects that are located near said stack facet.

11. The light emitting device according to claim 8, wherein each of said boundaries that are located near said stack facet is a {11–20} surface of said group III nitride group compound semiconductor.

12. The light emitting device according to claim 11, wherein at least a bottom layer of said group III nitride group compound semiconductor layer in said regions having less defects is formed by epitaxial lateral overgrowth.

13. The light emitting device according to claim 11, wherein at least said bottom layer is one of a group III nitride group compound semiconductor layer whose growing facet by epitaxial lateral overgrowth is a {11–20} surface, and a group III nitride group compound semiconductor layer that is formed on said group III nitride group compound semiconductor layer formed by epitaxial lateral overgrowth, whose growing facet is a {11–20} surface.

14. The light emitting device according to claim 8, wherein at least a bottom layer of said group III nitride group compound semiconductor layer in said regions having less defects is formed by epitaxial lateral overgrowth.

15. The light emitting device according to claim 8, wherein at least said bottom layer is one of a group III nitride group compound semiconductor layer whose growing facet by epitaxial lateral overgrowth is a {11–20} surface, and a group III nitride group compound semiconductor layer that is formed on said group III nitride group compound semiconductor layer formed by epitaxial lateral overgrowth, whose growing facet is a {11–20} surface.

16. The light emitting device according to claim 1, wherein said stack facet is formed to be parallel to said boundaries between said region of more defects and said region of less defects that are located near said stack facet.

17. The light emitting device according to claim 16, wherein each of said boundaries that are located near said stack facet is a {11–20} surface of said group III nitride group compound semiconductor.

18. The light emitting device according to claim 17, wherein at least said bottom layer is one of a group III nitride group compound semiconductor layer whose growing facet by epitaxial lateral overgrowth is a {11–20} surface, and a group III nitride group compound semiconductor layer that is formed on said group III nitride group compound semiconductor layer formed by epitaxial lateral overgrowth, whose growing facet is a {11–20} surface.

19. The light emitting device according to claim 16, wherein at least a bottom layer of said group III nitride group compound semiconductor layer in said regions having less defects is formed by epitaxial lateral overgrowth.

20. The light emitting device according to claim 16, wherein at least said bottom layer is one of a group III nitride group compound semiconductor layer whose growing facet by epitaxial lateral overgrowth is a {11–20} surface, and a group III nitride group compound semiconductor layer that is formed on said group III nitride group compound semiconductor layer formed by epitaxial lateral overgrowth, whose growing facet is a {11–20} surface.

21. The light emitting device according to claim 1, wherein each of said boundaries that are located near said stack facet is a {11–20} surface of said group III nitride group compound semiconductor.

22. The light emitting device according to claim 21, wherein at least a bottom layer of said group III nitride group compound semiconductor layer in said regions having less defects is formed by epitaxial lateral overgrowth.

23. The light emitting device according to claim 21, wherein at least said bottom layer is one of a group III nitride group compound semiconductor layer whose growing facet by epitaxial lateral overgrowth is a {11–20} surface, and a group III nitride group compound semiconductor layer that is formed on said group III nitride group compound semiconductor layer formed by epitaxial lateral overgrowth, whose growing facet is a {11–20} surface.

24. The light emitting device according to claim 1, wherein at least a bottom layer of said group III nitride group compound semiconductor layer in said regions having less defects is formed by epitaxial lateral overgrowth.

25. The light emitting device according to claim 24, wherein at least said bottom layer is one of a group III nitride group compound semiconductor layer whose growing facet by epitaxial lateral overgrowth is a {11–20} surface, and a group III nitride group compound semiconductor layer that is formed on said group III nitride group compound semiconductor layer formed by epitaxial lateral overgrowth, whose growing facet is a {11–20} surface.

26. The light emitting device according to claim 1, wherein at least said bottom layer is one of a group III nitride group compound semiconductor layer whose growing facet by epitaxial lateral overgrowth is a {11–20} surface, and a group III nitride group compound semiconductor layer that is formed on said group III nitride group compound semiconductor layer formed by epitaxial lateral overgrowth, whose growing facet is a {11–20} surface.

27. A laser diode using group III nitride group compound semiconductor comprising:
    a group III nitride group compound semiconductor layer;
    a cavity which is formed so as to traverse regions with many defects and regions with less defects in a longitudinal direction of said cavity, said regions being formed in said group III nitride group compound semiconductor layer; and
    a cavity facet which is formed on said region of said group III nitride group compound semiconductor layer with less defects.

28. The laser diode using group III nitride group compound semiconductor according to claim 27, wherein said cavity facet is formed by etched surfaces.

29. The laser diode using group III nitride group compound semiconductor according to claim 27, wherein said regions with many defects and regions with less defects, said regions being formed in said group III nitride group compound semiconductor layer, are formed in a striped pattern at least near said cavity facet.

30. The laser diode using group III nitride group compound semiconductor according to claim 28, wherein said regions with many defects and regions with less defects, said regions being formed in said group III nitride group compound semiconductor layer, are formed in a striped pattern at least near said cavity facet.

31. The laser diode using group III nitride group compound semiconductor according to claim 27, wherein said cavity facet is formed to be parallel to boundaries between said regions with many defects and regions with less defects, said regions being formed in said group III nitride group compound semiconductor layer, which are placed near said cavity facets.

32. The laser diode using group III nitride group compound semiconductor according to claim 29, wherein said cavity facet is formed to be parallel to boundaries between said regions with many defects and regions with less defects, said regions being formed in said group III nitride group compound semiconductor layer, which are placed near said cavity facets.

33. The laser diode using group III nitride group compound semiconductor according to claim 27, wherein each of said boundaries between said regions with many defects and regions with less defects, said regions being formed in said group III nitride group compound semiconductor layer, are placed near said cavity facets, is a {11–20} surface of said group III nitride group compound semiconductor.

34. The laser diode using group III nitride group compound semiconductor according to claim 29, wherein each of said boundaries between said regions with many defects and regions with less defects, said regions being formed in said group III nitride group compound semiconductor layer, are placed near said cavity facets, is a {11–20} surface of said group III nitride group compound semiconductor.

35. The laser diode using group III nitride group compound semiconductor according to claim 31, wherein each of said boundaries between said regions with many defects and regions with less defects, said regions being formed in said group III nitride group compound semiconductor layer, are placed near said cavity facets, is a {11–20} surface of said group III nitride group compound semiconductor.

36. The laser diode using group III nitride group compound semiconductor according to claim 27, wherein at least a bottom layer which exists in said regions with many defects and regions with less defects, said regions being formed in said group III nitride group compound semiconductor layer, is formed by epitaxial lateral overgrowth (ELO).

37. The laser diode using group III nitride group compound semiconductor according to claim 28, wherein at least a bottom layer which exists in said regions with many defects and regions with less defects, said regions being formed in said group III nitride group compound semiconductor layer, is formed by epitaxial lateral overgrowth (ELO).

38. The laser diode using group III nitride group compound semiconductor according to claim 29, wherein at least a bottom layer which exists in said regions with many defects and regions with less defects, said regions being formed in said group III nitride group compound semiconductor layer, is formed by epitaxial lateral overgrowth (ELO).

39. The laser diode using group III nitride group compound semiconductor according to claim 31, wherein at least a bottom layer which exists in said regions with many defects and regions with less defects, said regions being formed in said group III nitride group compound semiconductor layer, is formed by epitaxial lateral overgrowth (ELO).

40. The laser diode using group III nitride group compound semiconductor according to claim 33, wherein at least a bottom layer which exists in said regions with many defects and regions with less defects, said regions being formed in said group III nitride group compound semiconductor layer, is formed by epitaxial lateral overgrowth (ELO).

41. The laser diode using group III nitride group compound semiconductor according to claim 34, wherein at least a bottom layer which exists in said regions with many defects and regions with less defects, said regions being formed in said group III nitride group compound semiconductor layer, is formed by epitaxial lateral overgrowth (ELO).

42. The laser diode using group III nitride group compound semiconductor according to claim 36, wherein at least a bottom layer which exists in said regions with many defects and regions with less defects, said regions being formed in said group III nitride group compound semiconductor layer, is formed by epitaxial lateral overgrowth (ELO).

43. The laser diode using group III nitride group compound semiconductor according to claim 27, wherein at least said bottom layer which exists in said regions with many defects and regions with less defects, said regions being formed in said group III nitride group compound semiconductor layer, is a group III nitride group compound semiconductor layer whose growing facet by epitaxial lateral overgrowth (ELO) is {11–20} surface, or a group III nitride group compound semiconductor layer which is formed on said group III nitride group compound semiconductor layer formed by epitaxial lateral overgrowth (ELO), whose growing facet is {11–20} surface.

44. The laser diode using group III nitride group compound semiconductor according to claim 28, wherein at least said bottom layer which exists in said regions with many defects and regions with less defects, said regions being formed in said group III nitride group compound semiconductor layer, is a group III nitride group compound semiconductor layer whose growing facet by epitaxial lateral overgrowth (ELO) is {11–20} surface, or a group III nitride group compound semiconductor layer which is formed on said group III nitride group compound semiconductor layer formed by epitaxial lateral overgrowth (ELO), whose growing facet is {11–20} surface.

45. The laser diode using group III nitride group compound semiconductor according to claim 29, wherein at least said bottom layer which exists in said regions with many defects and regions with less defects, said regions being formed in said group III nitride group compound semiconductor layer, is a group III nitride group compound semiconductor layer whose growing facet by epitaxial lateral overgrowth (ELO) is {11–20} surface, or a group III nitride group compound semiconductor layer which is formed on said group III nitride group compound semiconductor layer formed by epitaxial lateral overgrowth (ELO), whose growing facet is {11–20} surface.

46. The laser diode using group III nitride group compound semiconductor according to claim 31, wherein at least said bottom layer which exists in said regions with many defects and regions with less defects, said regions being formed in said group III nitride group compound semiconductor layer, is a group III nitride group compound semiconductor layer whose growing facet by epitaxial lateral overgrowth (ELO) is {11–20} surface, or a group III nitride group compound semiconductor layer which is formed on said group III nitride group compound semiconductor layer formed by epitaxial lateral overgrowth (ELO), whose growing facet is {11–20} surface.

47. The laser diode using group III nitride group compound semiconductor according to claim 33, wherein at least said bottom layer which exists in said regions with many defects and regions with less defects, said regions being formed in said group III nitride group compound semiconductor layer, is a group III nitride group compound semiconductor layer whose growing facet by epitaxial lateral overgrowth (ELO) is {11–20} surface, or a group III nitride group compound semiconductor layer which is formed on said group III nitride group compound semiconductor layer formed by epitaxial lateral overgrowth (ELO), whose growing facet is {11–20} surface.

48. The laser diode using group III nitride group compound semiconductor according to claim 34, wherein at least said bottom layer which exists in said regions with many defects and regions with less defects, said regions being formed in said group III nitride group compound semiconductor layer, is a group III nitride group compound semiconductor layer whose growing facet by epitaxial lateral overgrowth (ELO) is {11–20} surface, or a group III nitride group compound semiconductor layer which is formed on said group III nitride group compound semiconductor layer formed by epitaxial lateral overgrowth (ELO), whose growing facet is {11–20} surface.

49. The laser diode using group III nitride group compound semiconductor according to claim 35, wherein at least said bottom layer which exists in said regions with many defects and regions with less defects, said regions being formed in said group III nitride group compound semiconductor layer, is a group III nitride group compound semiconductor layer whose growing facet by epitaxial lateral overgrowth (ELO) is {11–20} surface, or a group III nitride group compound semiconductor layer which is formed on said group III nitride group compound semiconductor layer formed by epitaxial lateral overgrowth (ELO), whose growing facet is {11–20} surface.

* * * * *